(12) United States Patent
Dixon et al.

(10) Patent No.: US 8,020,058 B2
(45) Date of Patent: Sep. 13, 2011

(54) MULTI-CHIP DIGITAL SYSTEM HAVING A PLURALITY OF CONTROLLERS WITH SELF-IDENTIFYING SIGNAL

(75) Inventors: Robert Christopher Dixon, Austin, TX (US); John Wayne Hartfiel, Austin, TX (US); Hien Minh Le, Cedar Park, TX (US); Tung Nguyen Pham, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 12/032,990

(22) Filed: Feb. 18, 2008

(65) Prior Publication Data
US 2009/0210566 A1 Aug. 20, 2009

Related U.S. Application Data

(62) Division of application No. 10/870,459, filed on Jun. 17, 2004, now Pat. No. 7,409,469.

(51) Int. Cl.
*G01R 31/28* (2006.01)

(52) U.S. Cl. ....................................................... 714/727

(58) Field of Classification Search .................... 714/727
See application file for complete search history.

(56) References Cited

U.S. PATENT DOCUMENTS

| 5,548,782 | A | 8/1996 | Michael et al. | |
|---|---|---|---|---|
| 7,152,173 | B2 | 12/2006 | Yuan | |
| 7,231,551 | B1 * | 6/2007 | Treue et al. | 714/30 |
| 7,353,440 | B2 * | 4/2008 | Ohwada et al. | 714/726 |
| 7,409,469 | B2 * | 8/2008 | Dixon et al. | 710/16 |
| 7,536,597 | B2 * | 5/2009 | McGowan | 714/30 |
| 2004/0006729 | A1 * | 1/2004 | Pendurkar | 714/733 |

* cited by examiner

*Primary Examiner* — James C Kerveros
(74) *Attorney, Agent, or Firm* — Matthew B. Talpis; Gregory K Goshorn; Greg Goshorn, P.C.

(57) ABSTRACT

The present invention provides for a system. The system includes a plurality of controllers, each controller comprising at least an output pin and a plurality of input pins and configured to receive self-identify control signals through one or more of the plurality of input pins and to transmit a controller self-identify signal through the output pin based on the self-identify control signals. Each output pin is coupled to an external system. A processor couples to a first input pin of the plurality of input pins of each of the plurality of controllers and is configured to generate self-identify control signals and to transmit the self-identify control signals to the plurality of controllers.

11 Claims, 2 Drawing Sheets

MULTI-CHIP DIGITAL SYSTEM HAVING A PLURALITY OF CONTROLLERS WITH SELF-IDENTIFYING SIGNAL

CROSS-REFERENCES TO RELATED APPLICATIONS

The present application is a Divisional Application and claims the benefit of the tiling date of an application entitled, "Multi-Chip Digital System Having a Plurality of Controllers with Input and Output Pins Wherein Self-Identification Signals Are Received and Transmitted" Ser. No. 10/870,459, now U.S. Pat. No. 7,409,469, filed Jun. 17, 2004, assigned to the assignee of the present application.

TECHNICAL FIELD

The present invention relates generally to the field of digital computer processing and, more particularly, to a system for multi-chip digital system signal identification.

BACKGROUND

Modern devices often employ electronic circuits to perform tasks and provide increasingly complex functionality. Increasing task complexity has led to circuits with more and more components, which has encouraged development of smaller components. Moreover, multiple circuits have been combined on a single substrate or chip to form an integrated circuit (IC). Developments in IC technology and packaging have yielded smaller and smaller integrated circuit packages, which results in an increasing number of signal connectors or "pins."

However, production of integrated circuits, and multiple chip systems, often includes testing and/or debugging in the design and/or production stages of development. Increasing pin count often adds complexity and complicates testing and/ or debugging an IC or multi-chip system. Testing and/or debugging multi-chip or IC systems typically requires identification of the signal name, function and/or output associated with a particular pin. Additionally, identifying a particular pin can require significant effort, and mis-identifying or otherwise erroneously interpreting pin characteristics can result in reduced product performance, increased testing and/ or debugging time, circuit damage, and/or other production problems.

Therefore, there is a need for a system and/or method for identifying pin and pin signal characteristics that addresses at least some of the problems and disadvantages associated with conventional systems and methods.

SUMMARY

The present invention provides for a system. The system includes a plurality of controllers, each controller comprising at least an output pin and a plurality of input pins and configured to receive self-identify control signals through one or more of the plurality of input pins and to transmit a controller self-identify signal through the output pin based on the self-identify control signals. Each output pin is coupled to an external system. A processor couples to a first input pin of the plurality of input pins of each of the plurality of controllers and is configured to generate self-identify control signals and to transmit the self-identify control signals to the plurality of controllers.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art. Moreover, for ease of explanation, the present invention is illustrated with respect to an input/output control system with a plurality of boundary scan macros on an integrated circuit. It will be understood by those skilled in the art that the present invention can be practiced with respect to other systems, such as, for example, multi-chip systems and interconnect systems, without departing from the scope or spirit of the invention.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
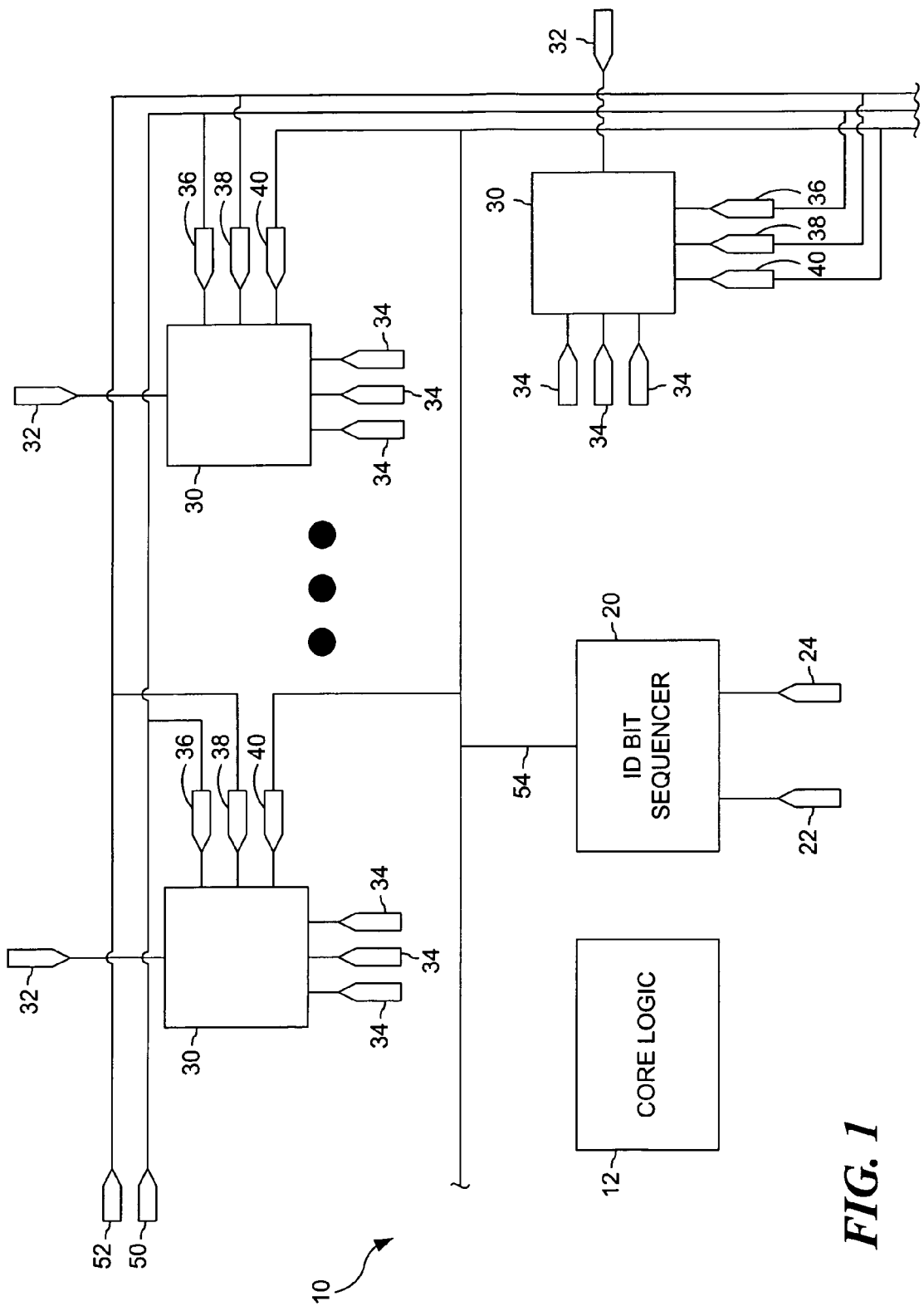
FIG. 1 is a block diagram depicting a self-identifying input/ output system.

Referring to FIG. 1 of the drawings, the reference numeral 10 generally designates a self-identifying input/output (I/O) system. Self-identifying I/O system 10 includes core logic 12, ID bit sequencer 20, and a plurality of macros 30. Core logic 12 is a processor, an electronic circuit or collection of circuits, or other device suitable to be configured to perform various tasks and to interact with the plurality of macros 30. ID bit sequencer 20 is a processor, an electronic circuit or collection of circuits, or other device suitable to be configured to generate self-identify control signals and to transmit self-identify control signals to the plurality of macros 30, as described in more detail below.

Each macro 30 is a processor, an electronic circuit or collection of circuits, or other device suitable to be configured to send and receive data, control signals, and other signals operating in a first mode, and to receive self-identify control signals and to transmit controller self-identify signals operating in a second mode, as described in more detail below. As used herein, "each" means all of a particular subset.

In one embodiment, macro 30 is an input/output (I/O) controller that, when operating in a first mode (the "ordinary operation mode"), generally sends and receives data to and from an external system through a primary I/O pad connection or "pin," processes data, and sends and receives data to and from an internal system, such as core logic 12, through one or more of a plurality of internal connections or pins.

In particular, macro 30 includes primary I/O pin 32, which is configured for bidirectional communication with an external system, and a plurality of internal pins 34, one or more of which are configured for bidirectional communication with the internal system. As used herein, an "external system" generally means a system external to self-identifying I/O system 10, and an "internal system" generally means a system internal to self-identifying I/O system 10.

When operating in a second mode (the "self-identify mode"), macro 30 generally receives self-identify control signals and generates and transmits controller self-identify signals based on received self-identify control signals. In one embodiment, macro 30 receives three self-identify control signals, ID_Suppress, ID_In_Progress, and ID_Bit_Selector.

In particular, macro 30 receives ID_Suppress signals from an ID_Suppress bus 50 through ID_Suppress pin 36, receives ID_In_Progress signals from an ID_In_Progress bus 52 through ID_In_Progress pin 38, and receives ID_Bit_Selector signals from an ID_Bit_Selector bus 54 through ID_Bit_Selector pin 40. Based on the received self-identify control signals, macro 30 generates a controller self-identify signal for output through primary I/O pin 32. It will be understood to one skilled in the art that although the various signals described herein are presented as binary digital signals, other suitable configurations can also be employed.

In operation, as described in additional detail below, macro 30 operates in ordinary operation mode when the ID_Suppress signal is asserted or otherwise at a logic high state. Macro 30 operates in self-identify mode when the ID_Suppress signal is de-asserted or otherwise at a logic low state and the ID_In_Progress signal is asserted or otherwise at a logic high state. ID bit sequencer 20 sends ID_Bit_Selector signals to macro 30 through ID_Bit_Selector bus 54, and based on the ID_Bit_Selector signals, macro 30 generates controller self-identify signals for output through primary I/O pin 32.

In a particular embodiment, the ID_Bit_Selector signals are a progression of values from 0 to $2^{(n-1)}$. The value of "n" can be selected based on the number of primary I/O pins 32 of the macros 30 in self-identifying I/O system 10. In particular, "n" is the next largest integer after "X", where X=$\log_2$ (# of primary I/O pins 32). For example, where self-identifying I/O system 10 includes 125 macros 30 and 125 primary I/O pins 32, X=6.9657843, and n=7. Additionally, as described in more detail below, "n" can also be used to set the number of bits in an identity value of a particular macro 30. It will be understood to one skilled in the art that the minimum number of bits required to provide a unique identity value for each macro 30 depends on the number of macros 30 in self-identifying I/O system 10, and the value of "n" can also be determined based on that minimum number of bits, or otherwise suitably determined. Thus, in one embodiment, ID bit sequencer 20 sends a series of ID_Bit_Selector signals to macro 30 through ID_Bit_Selector bus 54, comprising values from 0 to $2^{(n-1)}$, and macro 30 sends a series of controller self-identify signals through primary I/O pin 32, comprising a sequence of bits representing the unique identity value associated with the particular macro 30.

In the illustrated embodiment, ID bit sequencer 20 is configured to control the self-identification process, including the operation of ID_Suppress bus 50, ID_In_Progress bus 52, and ID_Bit_Selector bus 54. In an alternate embodiment, the self-identification process can be configured to be controlled by a separate internal component of self-identifying I/O system 10, a component external to self-identifying I/O system 10, such as, for example, a test kit or probe, a combination of internal and external components, or otherwise suitably configured.

In a particular embodiment, ID bit sequencer 20 includes ID_CLK pin 22 and ID_Controller_Reset pin 24. ID_CLK pin 22 is configured to receive an ID clock signal and ID_Controller_Reset pin 24 is configured to receive a reset signal. In an example operation, the ID_Suppress signal is de-asserted and the ID_In_Progress signal is asserted. ID bit sequencer 20 receives a reset signal through ID_Controller_Reset pin 24 and, based on the reset signal, sets a bit selector value to zero. The bit selector value is an integer value from 0 to $2^{(n-1)}$ and represents a particular bit order in a sequence of bits of a unique identity value associated with a particular macro 30, such as, for example, the first bit (0), the second bit (1), the third bit (2), and so forth. ID bit sequencer 20 receives an ID clock signal through ID_CLK pin 22 and sends an ID_Bit_Selector signal through ID_Bit_Selector bus 54 based on the ID clock signal and the bit selector value. In particular, in each clock cycle that ID bit sequencer 20 receives an ID clock signal, ID bit sequencer 20 sends an ID_Bit_Selector signal representing the bit selector value and increments the bit selector value by one. If the bit selector value is $2^{(n-1)}$, or ID bit sequencer 20 receives a reset signal, ID bit sequencer 20 sets the bit selector value to zero. Thus, ID bit sequencer 20 sends an orderly sequence of ID_Bit_Selector signals through ID_Bit_Selector bus 54, based on bit selector values cycling from 0 to $2^{(n-1)}$, until receiving a reset signal or the ID clock signal stops.

Moreover, a tester can be configured to be synchronized to the ID clock signal speed, sampling the output of primary I/O pin 32 as each bit of the unique identity value of macro 30, as expressed in the controller self-identify signals, is driven to primary I/O pin 32. The tester can also be configured to cross-reference the unique identity value of macro 30 with a signal or output pin name of primary I/O pin 32 associated with the signal or output of macro 30 when operating in ordinary operation mode.

Additionally, a tester can be configured to receive the controller self-identify signals of each macro 30 of self-identifying I/O system 10. Where the unique identity value of a particular macro 30, or the signal or output pin name of a particular primary I/O pin 32, is known to the tester, identifying each macro 30 of self-identifying I/O system 10 can be synchronized. For example, a calibration probe can be connected to the known primary I/O pin 32, so that during the self-identification process, the tester can identify at which cycle to sample the controller self-identify signals of the unknown primary I/O pins 32, based on the stream of data observed from the calibration probe. Thus, all of the macros 30 of self-identifying I/O system 10, and therefore the output of the primary I/O pins 32, can be identified, which provides increased efficiency and accuracy in testing and debugging.

Self-identifying I/O system 10 can also be employed in a multi-chip system environment. In one embodiment, all pins and/or buses dedicated to the self-identification process, except the ID_Suppress pins and buses, can be shared between each of a plurality of self-identifying I/O systems 10. For example, each self-identifying I/O system 10 can be coupled to a common ID_In_Progress bus, an ID_Bit_Selector bus, an ID_CLK bus, and an ID_Controller_Reset bus. To avoid signal contention among self-identifying I/O systems 10, each self-identifying I/O system 10 can be configured with a dedicated ID_Suppress bus. Thus, a tester can cycle through the self-identification process for various self-identifying I/O systems 10 in a multi-chip system, by de-asserting the ID_Suppress signal to a particular self-identifying I/O system 10 and asserting the ID_Suppress signals to the other self-identifying I/O systems 10. Additionally, each ID bit sequencer 20 can be configured to monitor the ID_Suppress bus and/or pins, and disable operations in response to ID clock signals and reset signals when the ID_Suppress signal is asserted. Thus, only the ID bit sequencer 20 of the particular self-identifying I/O system 10 under examination is in operation at a given time, which reduces unnecessary sequencing and operation, thereby reducing the test power required to perform the self-identification process in a multi-chip system.

Additionally, self-identifying I/O system 10 can be configured to comply with Institute of Electrical and Electronics Engineers (IEEE) standards. In particular, the ID_Suppress signal and the ID_In_Progress signal can be de-asserted, held at an inactive state, or otherwise maintained at logic low during IEEE 1149 Joint Test Action Group (JTAG) testing. It will be understood to one skilled in the art that the ID_Suppress signal and the ID_In_Progress signal can also be de-asserted during manufacturing tests that gauge the correct functionality of each I/O cell, other manufacturing and/or debugging tests, or other suitable operations.

Figure 2:
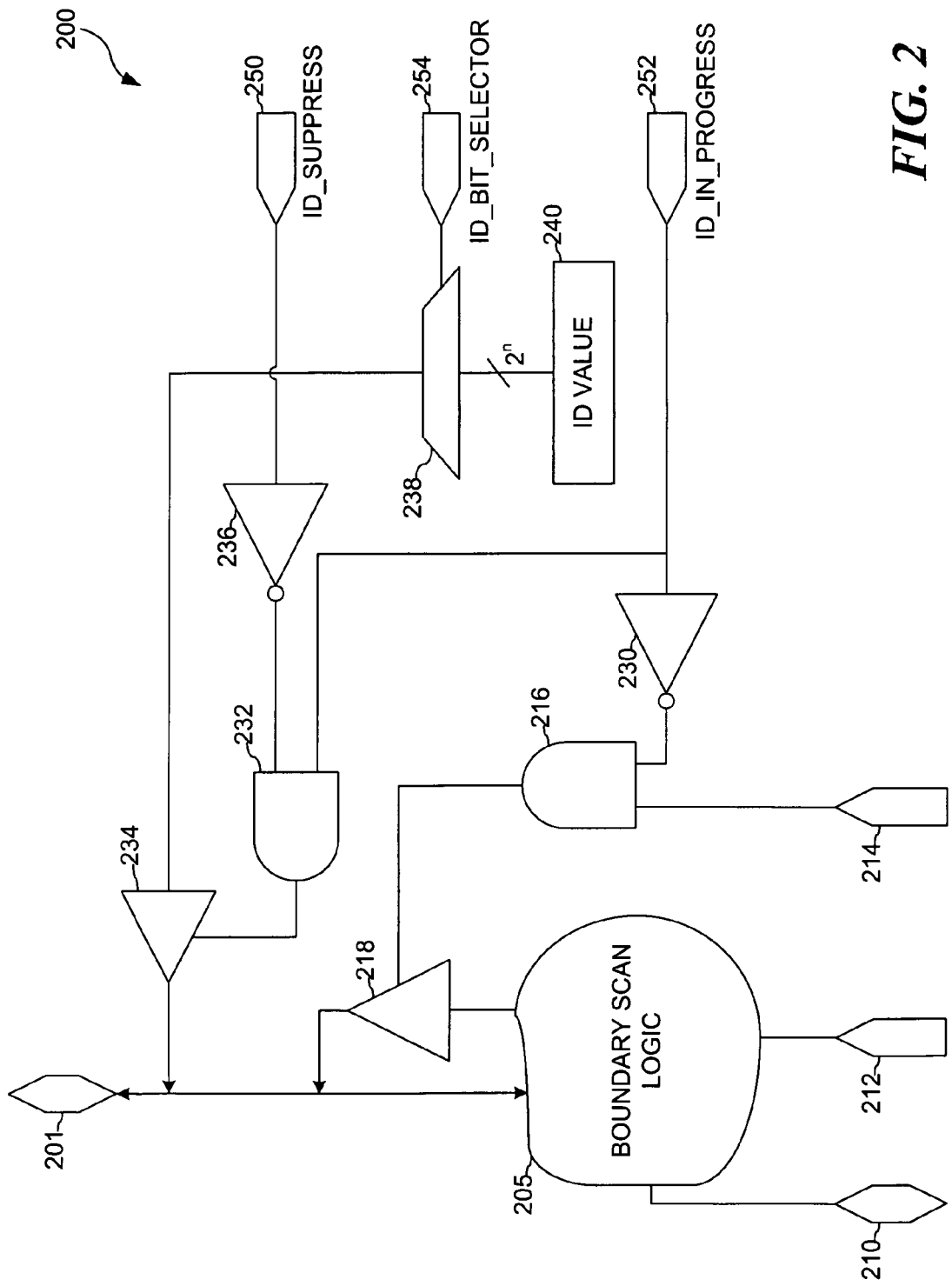
FIG. 2 is a block diagram depicting a self-identifying macro.

Referring now to FIG. 2, the reference numeral 200 generally designates a macro, such as, for example, macro 30 of FIG. 1. Macro 200 includes primary I/O pin 201. Primary I/O pin 201 is a pad connection or other suitable pin, configured to send and receive signals to and from an external system. Primary I/O pin 201 is coupled to boundary scan logic 205. Boundary scan logic 205 is a processor, an electronic circuit or collection of circuits, or other device suitable to be configured to send and receive data, control signals, and other signals. Boundary scan logic 205 is coupled to control pin 210. Control pin 210 is a pin or other suitable connection, configured to send and receive signals to and from an internal system. In particular, control pin 210 is configured to receive control signals and other input, such as, for example, input signals, test signals, driving load indicator signals, and other signals. Boundary scan logic 205 is also coupled to data pin 212. Data pin 212 is a pin or other suitable connection, configured to send and receive signals to and from an internal system. In particular, data pin 212 is configured primarily to send data to the internal system.

Macro 200 also includes tristate control pin 214. Tristate control pin 214 is a pin or other suitable connection, configured to send and receive signals to and from an internal system. In particular, tristate control pin 214 is configured primarily to receive tristate control signals from the internal system. Tristate control pin 214 is coupled to a first gate 216. First gate 216 is an electronic device, circuit or other logic configured as an AND gate. First gate 216 is coupled to a tristate buffer 218. Tristate buffer 218 is an electronic device, circuit or other logic configured as a buffer or driver. Tristate buffer 218 is coupled to boundary scan logic 205 and primary I/O pin 201.

Generally, when operating in ordinary operation mode, macro 200 receives signals through primary I/O pin 201, which are processed by boundary scan logic 205, resulting in data signals sent to the internal system through data pin 212, based on control signals and other input received from the internal system by boundary scan logic 205 through control pin 210. Boundary scan logic 205 also receives control signals and other input from the internal system and, subject to the operation of tristate buffer 218, sends signals to an external system through primary I/O pin 201. Macro 200 also receives tristate control signals from the internal system through tristate control pin 214, which, in one embodiment, is a logic high signal. The tristate control signals received through tristate control pin 214 are one input to first gate 216. The other input is described in more detail below. When both inputs to first gate 216 are at logic high, the output of first gate 216 is also at logic high, activating a first mode of tristate buffer 218. When either input to first gate 216 is not at logic high, the output of first gate 216 is at logic low, activating a second mode of tristate buffer 218. When operating in the first mode, tristate buffer 218 is configured to enable boundary scan logic 205 to send signals to an external system through primary I/O pin 201. When operating in the second mode, tristate buffer 218 is configured to disable boundary scan logic 205 from sending signals to an external system. In one embodiment, tristate buffer 218 can be configured to activate a high impedance state.

Macro 200 also includes ID_Suppress pin 250, ID_In_Progress pin 252, and ID_Bit_Selector pin 254. ID_Suppress pin 250 is a pin or other suitable connection and is configured to receive signals from the internal system. In particular, ID_Suppress pin 250 is coupled to an ID_Suppress bus and is configured to receive ID_Suppress signals. ID_In_Progress pin 252 is a pin or other suitable connection and is configured to receive signals from the internal system. In particular, ID_In_Progress pin 252 is coupled to an ID_In_Progress bus and is configured to receive ID_In_Progress signals. ID_Bit_Selector pin 254 is a pin or other suitable connection and is configured to receive signals from the internal system. In particular, ID_Bit_Selector pin 254 is coupled to an ID_Bit_Selector bus and is configured to receive ID_Bit_Selector signals.

Macro 200 also includes a first inverter 230, a second gate 232, an ID buffer 234, a second inverter 236, a multiplexer 238, and an identity value 240. First inverter 230 is coupled to first gate 216 and ID_In_Progress pin 252, and is an electronic device, circuit or other logic configured to receive an electronic signal and generate an electronic signal based on the received electronic signal. In particular, first inverter 230 receives an ID_In_Progress signal from ID_In_Progress pin 252 and transmits the logical inverse of the received ID_In_Progress signal to first gate 216. Thus, for example, when macro 200 is operating in ordinary operation mode, the ID_In_Progress signal is de-asserted, or otherwise at logic low, and first inverter 230 sends a logic high signal to first gate 216. As described above, the two inputs to first gate 216, through tristate control pin 214 and first inverter 230, determine the output of first gate 216 and, therefore, the operation of tristate buffer 218.

ID buffer 234 is coupled to primary I/O pin 201, second gate 232, and multiplexer 238. ID buffer 234 is an electronic device, circuit or other logic configured as a buffer or driver. In a particular embodiment, ID buffer 234 receives a signal or output from second gate 232. When the output from second gate 232 is at a logic low, ID buffer 234 is configured to operate in a first mode. Operating in a first mode, ID buffer 234 is disabled from sending controller self-identify signals to primary I/O pin 201. When the output from second gate 232 is at logic high, ID buffer 234 is configured to operate in a second mode. Operating in a second mode, ID buffer 234 receives ID bit signals from multiplexer 238 and sends controller self-identify signals to primary I/O pin 201.

Second gate 232 is coupled to ID buffer 234, second inverter 236 and ID_In_Progress pin 252. Second gate 232 is an electronic device, circuit or other logic configured as an AND gate. In a particular embodiment, second gate 232 receives signals or output from second inverter 236 and ID_In_Progress pin 252 and sends signals to ID buffer 234 based on the received signals. For example, when either or both inputs to second gate 232 are at logic low, the output of second gate 232 is also at logic low, activating a first mode of ID buffer 234. When the two inputs to second gate 232, the output of second inverter 236 and ID_In_Progress pin 252, are both at logic high, the output of second gate 232 is also at logic high, activating a second mode of ID buffer 234.

Second inverter 236 is coupled to second gate 232 and ID_Suppress pin 250, and is an electronic device, circuit or other logic configured to receive an electronic signal and generate an electronic signal based on the received electronic signal. In particular, second inverter 236 receives an ID_Suppress signal from ID_Suppress pin 250 and transmits the logical inverse of the received ID_Suppress signal to second gate 232. Thus, for example, when macro 200 is operating in ordinary operation mode, the ID_Suppress signal is asserted, or otherwise at logic high, and second inverter 236 sends a logic low signal to second gate 232.

Thus, when macro 200 is operating in ordinary operation mode, the ID_In_Progress signal is at logic low and the ID_Suppress signal is at logic high. The two inputs to second gate 232 are therefore both at a logic low, based on the ID_In_Progress signal through ID_In_Progress pin 252 and the ID_Suppress signal, as inverted through second inverter 236. Accordingly, as described above, the output of second gate 232 is at logic low, activating a first mode of ID buffer 234, wherein ID buffer 234 is disabled from sending controller self-identify signals to primary I/O pin 201. Therefore, macro 200 can be configured to disable controller self-identify signals when operating in ordinary operation mode, allowing normal operation without potential interference from a self-identify signal data stream.

Macro 200 also includes multiplexer 238 and ID value 240. ID value 240 is coupled to multiplexer 238 and is an electronic device, circuit or other logic configured to send identity signals to multiplexer 238, based on a unique identity value associated with macro 200. As described above, the unique identity value associated with a particular macro 200 uniquely identifies the particular macro 200, and can comprise a numerical value associated with a signal name of the output of macro 200 when operating in ordinary operation mode, a pin name of primary I/O pin 201, a physical location of macro 200 on an integrated circuit, or be otherwise suitably configured. In a particular embodiment, ID value 240 is an electronic circuit configured with a strapped binary value representing the unique identity value associated with macro 200. In one embodiment, as described above, the unique identity value is a sequence of $2^n$ bits.

It will be understood to one skilled in the art that the unique identity value can be unique only within a certain integrated circuit or multi-chip environment. For example, where a particular integrated circuit is mass-produced, each integrated circuit in the group of mass-produced chips will typically include the same components on substantially identical chips, such as a first macro and a second macro. Accordingly, each macro on any particular chip will typically have a comparable macro on the other chips in the group. Thus, for example, the unique identity value of a first macro on a first chip can be identical to the unique identity value of a first macro on a second chip, and different from the unique identity value of a second macro on the first chip and a second macro on the second chip. Similarly, the unique identity value of the second macro on the first chip can be identical to the unique identity value of the second macro on the second chip, and different from the unique identity value of the first macro on the first chip and the first macro on the second chip. Therefore, the unique identity value can be standardized for a particular chip design and/or within a group of mass-produced chips.

Multiplexer 238 is coupled to ID buffer 234, ID value 240, and ID_Bit_Selector pin 254. Multiplexer 238 is an electronic device, circuit or other logic configured to operate as a multiplexer. In a particular embodiment, multiplexer 238 receives ID_Bit_Selector signals from ID_Bit_Selector pin 254 and sends ID bit signals to ID buffer 234 based on the received ID_Bit_Selector signals and ID value 240, or identity signals received from ID value 240.

For example, where ID value 240 is an electronic circuit configured with a $2^n$ bit strapped identity value and the ID_Bit_Selector signals are based on bit selector values cycling from 0 to $2^{(n-1)}$ multiplexer 238 receives an ID_Bit_Selector signal through ID_Bit_Selector pin 254 identifying a particular bit of the identity value. Multiplexer 238 retrieves, reads, or otherwise receives from ID value 240 the particular bit identified by the ID_Bit_Selector signal and sends an ID bit signal to ID buffer 234 based on that particular bit.

In one embodiment, the ID bit signal is the particular bit value, as represented by a logic high (1) or logic low (0) signal. Thus, multiplexer 238 can be configured to send a sequence of ID bit signals to ID buffer 234, based on a sequence of ID_Bit_Selector signals received through ID_Bit_Selector pin 254.

ID buffer 234 receives the ID bit signals from multiplexer 238 and generates a controller self-identify signal or signals based on the ID bit signals. In one embodiment, the controller self-identify signal is a sequence of bit values based on a sequence of ID bit signals received from multiplexer 238. Thus, macro 200 can be configured to drive a strapped binary identity value, bit by bit, in sequence to the primary I/O pin 201.

As described above, when operating in a second mode, ID buffer 234 is configured to send controller self-identify signals to primary I/O pin 201, and, when operating in a first mode, ID buffer 234 is disabled from sending controller self-identify signals to primary I/O pin 201. However, ID buffer 234 can be configured to receive ID bit signals from multiplexer 238 when operating in either the first mode or the second mode. It will be understood to one skilled in the art that other configurations can also be employed.

Generally, in operation in one embodiment, macro 200 operates in either ordinary operation mode or self-identify mode. In one embodiment, in ordinary operation mode, the ID_Suppress signal is typically at logic high and the ID_In_Progress signal is typically at logic low. Moreover, the ID_Bit_Selector signal is typically at logic low or otherwise not in operation. Macro 200 can continue to operate in ordinary operation mode while either the ID_Suppress signal remains at logic high or the ID_In_Progress signal remains at logic low. Thus, even if the ID_Suppress signal is de-asserted, macro 200 can continue to operate in ordinary operation mode until the ID_In_Progress signal is asserted or at logic high. Accordingly, where a system or component failure disables the ID_Suppress signal, such as, for example, an ID_Suppress bus failure or an ID_Suppress pin 250 failure and/or disconnection, macro 200 can continue to operate in ordinary operation mode.

In one embodiment, in self-identify mode, the ID_Suppress signal is de-asserted or otherwise at logic low and the ID_In_Progress signal is asserted or otherwise at logic high. As described above, when the ID_In_Progress signal is at logic high, the first gate 216 output is at logic low, activating a second mode of tristate buffer 218, and boundary scan logic 205 is disabled from sending signals to primary I/O pin 201.

When the ID_Suppress signal is at a logic low and the ID_In_Progress signal is at a logic high, the second gate 232 output is at logic high, activating a second mode of ID buffer 234, wherein ID buffer 234 is enabled to send controller self-identify signals to primary I/O pin 201. As ID_Bit_Selector signals are received, multiplexer 238 sends ID bit signals to ID buffer 234, as described above. With ID buffer 234 operating in a second mode, ID buffer 234 sends controller self-identify signals to primary I/O pin 201 based on ID bit signals received from multiplexer 238. Thus, macro 200 can be configured to send controller self-identify signals through primary I/O pin 201 that represent a unique identity value associated with macro 200. Accordingly, test engineers, debug engineers, and other users can identify a particular macro 200 through the controller self-identify signals, which can save a significant amount of time and expense and can increase accuracy and product reliability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A system, comprising:
a plurality of controllers, each controller comprising at least an output pin and a plurality of input pins and configured to receive self-identify control signals through one or more of the plurality of input pins and to transmit a controller self-identify signal through the output pin based on the self-identify control signals; wherein each output pin is coupled to an external system, and
a processor coupled to a first input pin of the plurality of input pins of each of the plurality of controllers and configured to generate self-identify control signals and to transmit the self-identify control signals to the plurality of controllers.

2. The system as recited in claim 1, wherein the processor is further configured to receive controller selection signals and to generate self-identify control signals based on the controller selection signals.

3. The system as recited in claim 2, further comprising a tester coupled to the output pin of each of the plurality of controllers and the processor, and configured to generate controller selection signals, to transmit controller selection signals to the processor, and to receive controller self-identify signals from each of the plurality of controllers.

4. The system as recited in claim 1, wherein the self-identify control signals comprise an ID_Suppress signal, an ID_In_Progress signal, and an ID_Bit_Selector signal.

5. The system as recited in claim 1, further comprising a plurality of controller identifiers each configured to uniquely identify one of the plurality of controllers.

6. The system as recited in claim 5, wherein at least one controller further comprises a controller identifier, and the controller identifier is hardwired in the at least one controller.

7. The system as recited in claim 1, wherein the controller self-identify signal comprises a series of bits.

8. The system as recited in claim 1, wherein at least one controller is a boundary scan macro.

9. A computer program product, the computer program product having a medium with a computer program embodied thereon, the computer program comprising:
computer program code for generating self-identify control signals;
computer program code for transmitting the self-identify control signals to one of a plurality of input pins of a first controller of a plurality of controllers, wherein each controller is configured to receive self-identify control signals;
computer program code for generating, by the first controller, a first controller self-identify signal based on received sell-identify control signals;
computer program code for transmitting, by the first controller, through an output pin of the first controller, the first controller self-identify signal, to an external system; and
computer program code for identifying the first controller based on the first controller self-identify signal.

10. The computer program product as recited in claim 9, wherein the first controller self-identify signal is based on received self-identify control signals and a first controller identifier configured to uniquely identify the first controller.

11. The computer program product as recited in claim 9, further comprising:
computer program code for transmitting the self-identify control signals to one of a plurality of input pins of a second controller, the second controller configured to receive self-identify control signals;
computer program code for generating, by the second controller, a second controller self-identify signal based on received self-identify control signals; and
computer program code for transmitting, by the second controller, through an output pin of the second controller, the second controller self-identify signal, to an external system.

* * * * *